United States Patent

Miyano et al.

[11] Patent Number: 5,958,259
[45] Date of Patent: Sep. 28, 1999

[54] METHOD FOR FORMING A BALL IN WIRE BONDING

[75] Inventors: Fumio Miyano, Akiruno; Tatsunari Mii, Musashi Murayama, both of Japan

[73] Assignee: Kabushiki Kaisha Shinkawa, Tokyo, Japan

[21] Appl. No.: 08/953,759

[22] Filed: Oct. 17, 1997

[30] Foreign Application Priority Data

Oct. 17, 1996 [JP] Japan .................................. 8-295794

[51] Int. Cl.⁶ .................................................. B23K 9/04
[52] U.S. Cl. ........................................ 219/56.22; 219/122
[58] Field of Search .............................. 219/56.22, 56.21, 219/74, 75, 122; 228/111, 179.1

[56] References Cited

FOREIGN PATENT DOCUMENTS

| 1-256134 | 10/1989 | Japan . |
| 5-36748 | 2/1993 | Japan . |
| 5-102233 | 4/1993 | Japan . |
| 7-37930 | 2/1995 | Japan . |
| 7-176560 | 7/1995 | Japan . |
| 7-263480 | 10/1995 | Japan . |

Primary Examiner—Clifford C. Shaw
Attorney, Agent, or Firm—Koda & Androlia

[57] ABSTRACT

In a fixed type discharge electrode system employed for forming a ball on a bonding wire so that a discharge electrode is provided near the tip end of a bonding wire, a gas, such as air, is blown to the spark discharged between the discharge electrode and the tip end of the bonding wire in the direction from the discharge electrode so as to bend the discharged spark and the discharged spark that faces the bonding wire is positioned beneath the bonding wire.

1 Claim, 2 Drawing Sheets

METHOD FOR FORMING A BALL IN WIRE BONDING

BACKGROUND OF THE INVENTION

1. Field of the Invention

The present invention relates to a method for forming a ball on a bonding wire used in wire bonding and more particularly to a method that applies a high voltage across the tip end of the wire and a discharge electrode so as to generate an electric discharge between them to form the ball on the bonding wire.

2. Prior Art

Discharge electrode systems employed in wire bonding include a fixed type discharge electrode system, in which the discharge electrode is positionally fixed, and a movable type discharge electrode system, in which the discharge electrode is moved by a solenoid, etc. The fixed type discharge electrode system is disclosed in, for example, Japanese Patent Application Kokai No. 7-263480; and the movable type discharge electrode system is disclosed in, for instance, Japanese Patent Application Laid-Open (Kokai) Nos. H5-36748, H5-102233 and H7-176560.

In the fixed type discharge electrode systems, a discharge electrode is positioned on one side of the tip end of the wire so that the electrode can be located as close as possible to the tip end of the wire with a space in between which can avoid contact with the wire when the capillary (which the wire passes through) is lowered. In the movable type discharge electrode system, on the other hand, a discharge electrode is moved so as to be positioned directly beneath the tip end of the wire, and then an electric discharge is generated by the discharge electrode to form a ball on the wire. Thus in this system, the discharge electrode is retracted from beneath the capillary after the ball is formed.

In the fixed type discharge electrode systems, a driving means or control means which moves the discharge electrode is not required unlike the movable type discharge electrode system. As a result, the fixed type discharge electrode systems have a number of superior features. The overall weight of the bonding head can be reduced, high-speed operation is possible, the cost of the apparatus can be low and maintenance is easy.

In the movable type discharge electrode systems, the electric discharge is generated with the discharge electrode moved directly beneath the tip end of the wire. Accordingly, this system can form a ball so as not to be eccentric with respect to the center of the wire. On the other hand, though the fixed type discharge electrode systems have various advantages as described above, the electric discharge is performed with the discharge electrode positioned on one side of the tip end of the wire; accordingly, it is likely that eccentric balls or warped balls are formed. For this reason, the movable type discharge electrode systems are generally more widely used than the fixed type discharge electrode systems.

A ball formation by the fixed type discharge electrode system is shown in FIGS. 3 and 4.

As seen from FIG. 3, in the fixed type discharge electrode system, a discharge electrode 3 is positioned to one side of the tip end of a wire 2 which passes through a capillary 1. Accordingly, when the electric discharge is generated, discharge sparks 4a, 4b and 4c are, as shown in FIG. 4(a), discharged toward the wire 2 from the side of the wire 2; and therefore, the tip end of the wire 2 melts from the directions of the discharge sparks 4a, 4b and 4c. As a result, the formed balls 5a, 5b and 5c are eccentric or get warped as shown by the ball 5d in FIG. 4(b) which deviates from the center of the diameter of the wire 2.

In addition, if any contaminant adheres to the tip end of the discharge electrode 3, the electric discharge generates from the side surface (upper surface in FIG. 4(a)) of the discharge electrode 3 as shown by the discharge spark 4c. In such a case, since the wire 2 begins to melt not from the tip end but from the position of the ball 5c, the wire 2 is cut at an intermediate point before a ball is formed, or an extremely small ball is formed on the wire 2. Even if the wire 2 is not cut at an intermediate point, a ball with a distorted shape such as that shown in FIG. 4(c) at 5e tends so be formed. This problems leads to an inconsistent ball diameter.

SUMMARY OF THE INVENTION

Accordingly, the object of the present invention is to provide a method in a fixed type discharge electrode system that forms a ball on a bonding wire without causing any deviation from the center of the wire and distorted shape and further provides the formed ball with a consistent diameter.

The method of the present invention which accomplishes the object is characterized by the fact that in a ball formation method used in wire bonding in which a discharge electrode is positioned beside the tip end of a wire and a ball is formed on the tip end of the wire by applying a high voltage across the tip end of the wire and the discharge electrode so as to cause an electric discharge to occur, a gas is blown against the discharge spark from the direction of the discharge electrode, thus causing the discharge spark to be curved so that the portion of the discharge spark that faces the wire is positioned beneath the wire.

DETAILED DESCRIPTION OF THE INVENTION

One embodiment of the present invention will be described with reference to FIGS. 1 and 2.

Figure 1:
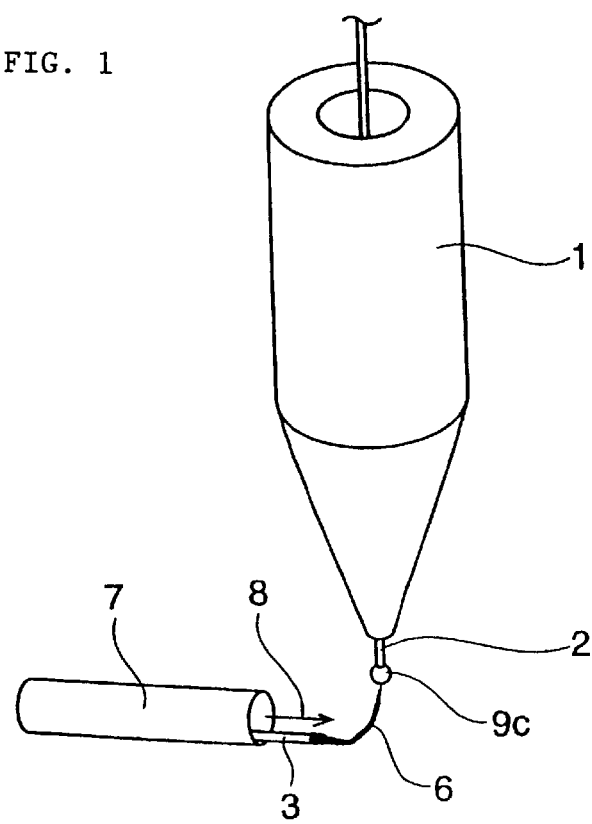
FIG. 1 is a schematic explanatory diagram which illustrates one embodiment of the present invention.

As shown in FIG. 1, during ball formation, a capillary 1 is lowered so that the tip end of a wire 2 which passes through the capillary 1 is positioned beside a discharge electrode 3, and an electric discharge is performed on the tip end of the wire 2 by this discharge electrode 3. In the present embodiment, a gas 8 is blown against the discharged spark 6 via a pipe 7 so that the gas is blown from the discharge electrode 3 side during the discharge performed by the discharge electrode 3. It is configured that when the gas 8 is blown, the portion of the discharged spark 6 that faces the wire 2 is positioned beneath the wire 2 as seen from FIG. 1; and the gas 8 is constantly blown in this state.

It can be designed so that a means which allows a manual discharge and stopping of the gas 8 or a means which automatically discharges or stops the gas 8 in synchronization with the discharged spark 6 is provided.

Figure 2A:
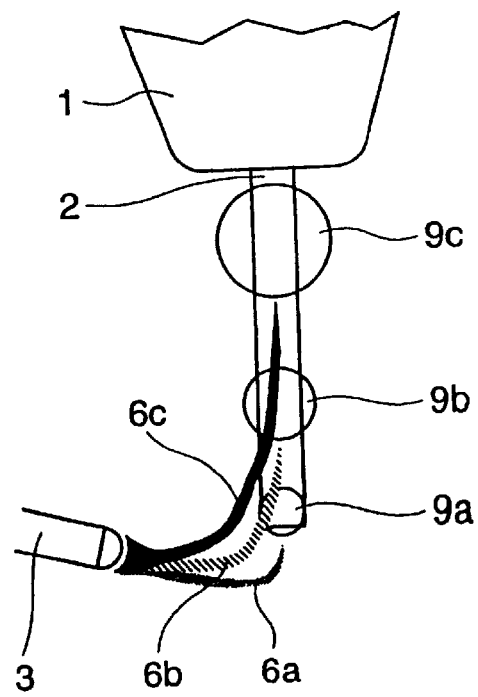
FIG. 2(a) is an explanatory diagram which illustrates the ball formation.
Figure 2B:
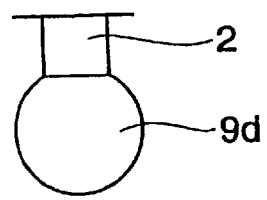
FIG. 2(b) is an explanatory diagram which shows the ball that is formed.
Figure 3:
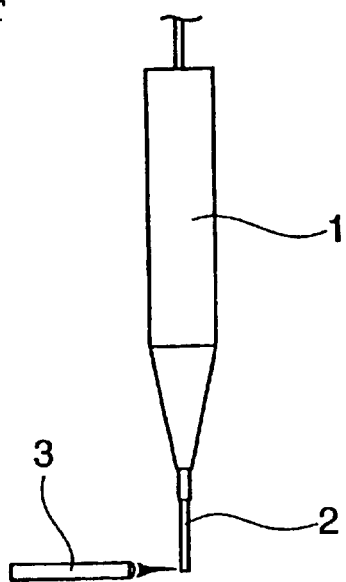
FIG. 3 is a schematic explanatory diagram which illustrates a conventional ball forming method.
Figure 4A:
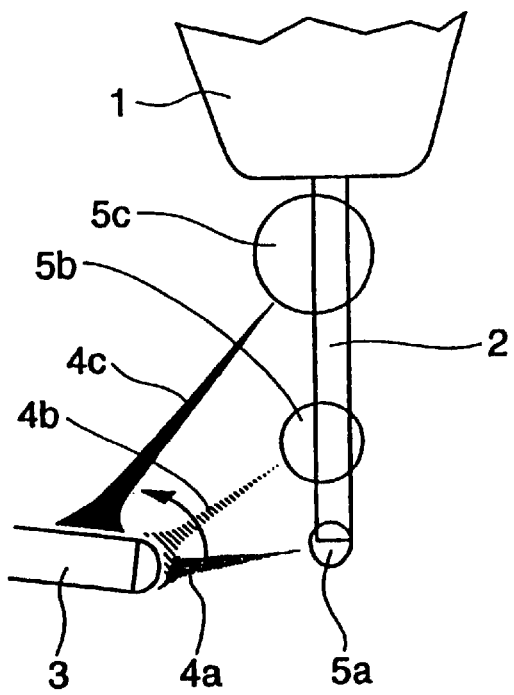
FIG. 4(a) is an explanatory diagram which illustrates conventional ball formation.
Figure 4B:
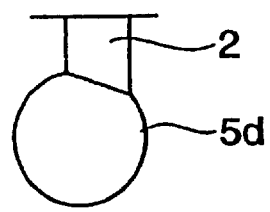
FIGS. 4(b) and 4(c) are explanatory diagrams which show balls that are formed.
Figure 4C:
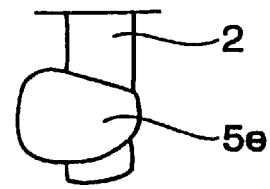

The gas 8 blown against the discharged spark 6 from the direction of the discharge electrode 3 can bend (the shapes of) the discharge sparks 6a, 6b and 6c, as shown in FIG. 2(a), into a circular arc form. Accordingly, the portions of the discharge sparks 6a, 6b and 6c that face the wire 2 are positioned beneath the wire 2. As a result, the wire 2 is melted by the discharged sparks 6a, 6b and 6c which are respectively applied to the wire from directly beneath the wire so that balls 9a, 9b and 9c are formed on the wire 2. Accordingly, as shown in FIG. 2(b), a ball 9d which does not deviate from the center of the wire 2 and which does not show a distorted shape is formed constantly.

The sparks 6a, 6b and 6c which are bent by the gas 8 are discharged from the closest point on the discharge electrode 3, i.e., from the tip end portion of the discharge electrode 3. Accordingly, since the discharging position is constant on the discharge electrode 3, a stable electric discharge is generated, and the ball diameter can be constant.

Experiments show that when the gas 8, which is air, is blown at a flow rate of 2.5 liters/minute using a pipe 7 that has an internal diameter of 4 mm, a ball 9c with no eccentricity and with no variation in diameter is obtained.

The same results are also obtained when a reducing gas, inert gas, etc., is used as the gas 8; and it is more effective to use a reducing gas, inert gas or the like in cases where a ball is to be formed on an easily oxidizable wire 2.

Meanwhile, Japanese Patent Application Laid-Open (Kokai) Nos. 1-256134, 5-36748 and 7-37930 show that a gas is blown into the electric discharge region. However, the devices shown in these prior art relate to movable type discharge electrode systems. In movable type discharge electrode systems, balls are formed without any eccentricity in the first place; and in such systems, the electric discharging point is formed into a projected shape, or areas other than the discharging point are covered by a cover in order to stabilize the discharge position, thus forming balls in a stable fashion. However, the purpose of blowing a gas into the discharge region in such systems is to form a gas atmosphere in the discharge region so that oxidation of the ball is prevented. Accordingly, these prior art do not suggest a non-eccentric ball formation in a fixed type discharge electrode system as in the invention of the present application.

As seen from the above, according to the present invention, a gas is blown onto the discharged spark from the direction of the discharge electrode so as to cause the discharged spark to be bent and the portion of the discharged bent spark that faces the wire is positioned beneath the wire. Accordingly, in a fixed type discharge electrode system, balls which do not deviate from the center of the wire and do not show a distorted shape can be formed, and the diameter of the formed ball can be constant.

We claim:

1. A method for forming a ball in wire bonding, wherein a high voltage is applied across a tip end of a wire and a discharge electrode, which is positioned beside said tip end of said wire with a longitudinal axis of said discharge electrode being substantially tranverse to a longitudinal axis of said wire, so as to generate an electric discharge and form said ball on said tip end of said wire, said method being characterized in that a gas is blown in a direction of said longitudinal axis of said discharge electrode against a discharged spark from said discharge electrode and across said tip end of said wire, thus causing said discharged spark to be curved so that a portion of said discharged spark that contacts said tip end of said wire is directed along said longitudinal axis of said wire whereby a ball of constant diameter on the tip end of said wire is formed.

* * * * *